(12) United States Patent
Wang et al.

(10) Patent No.: US 9,904,125 B2
(45) Date of Patent: Feb. 27, 2018

(54) DISPLAY PANEL AND MANUFACTURING METHOD THEREOF

(71) Applicant: Century Technology (Shenzhen) Corporation Limited, Shenzhen (CN)

(72) Inventors: Ming-Tsung Wang, New Taipei (TW); Chih-Chung Liu, New Taipei (TW); Kuo-Chieh Chi, New Taipei (TW); Jian-Xin Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 38 days.

(21) Appl. No.: 14/750,177

(22) Filed: Jun. 25, 2015

(65) Prior Publication Data
US 2016/0062198 A1 Mar. 3, 2016

(30) Foreign Application Priority Data
Aug. 29, 2014 (CN) .......................... 2014 1 0434066

(51) Int. Cl.
*H01L 27/12* (2006.01)
*G02F 1/1343* (2006.01)
(Continued)

(52) U.S. Cl.
CPC ...... *G02F 1/134363* (2013.01); *H01L 27/124* (2013.01); *G02F 2001/133388* (2013.01);
(Continued)

(58) Field of Classification Search
CPC ......... G02F 1/134363; G02F 1/136286; G02F 2001/134381; G02F 1/1362; G02F 1/1368; G02F 2001/134372; G02F 2001/136254; G02F 1/13439; G02F 2001/136295; G02F 1/133345; G02F 1/133514; G02F 1/1339; G02F 1/13394; G02F 1/134309; G02F 2001/13398; G02F 2001/13629;
(Continued)

(56) References Cited

U.S. PATENT DOCUMENTS

| 2004/0263750 A1* | 12/2004 | Chae ................. G02F 1/134363 349/141 |
| 2005/0269928 A1* | 12/2005 | Kim ....................... B82Y 10/00 313/311 |
| 2007/0296901 A1* | 12/2007 | Seo .................... G02F 1/134363 349/141 |
| 2008/0173871 A1* | 7/2008 | Noda ................... H01L 27/1214 257/59 |
| 2009/0148970 A1* | 6/2009 | Hosoya ............... H01L 27/1214 438/29 |

(Continued)

FOREIGN PATENT DOCUMENTS

| CN | 103035652 A | 4/2013 |
| CN | 103268029 A | 8/2013 |

*Primary Examiner* — Mark Tornow
*Assistant Examiner* — Priya Rampersaud
(74) *Attorney, Agent, or Firm* — ScienBiziP, P.C.

(57) ABSTRACT

A display panel includes a substrate, a plurality of thin film transistors (TFTs), a plurality common electrodes, a plurality of common electrode lines, a plurality of coupling electrodes, and a plurality of pixel electrodes. Each of the TFTs comprises a gate, a source, a drain and a channel layer coupling the source to the drain. The gate, the common electrodes, and the common electrode lines are formed on a surface of the substrate and are separated from each other. Each of the coupling electrodes couples a corresponding common electrode to a corresponding common electrode line, and a space is defined between the corresponding common electrode and the corresponding common electrode line.

7 Claims, 13 Drawing Sheets

(51) Int. Cl.
*G02F 1/1333* (2006.01)
*G02F 1/1362* (2006.01)

(52) U.S. Cl.
CPC ............ *G02F 2001/136295* (2013.01); *G02F 2201/121* (2013.01)

(58) Field of Classification Search
CPC ..... H01L 27/1288; H01L 21/77; H01L 27/12; H01L 27/124; H01L 22/32; H01L 29/66765; H01L 29/7869; H01L 21/0274; H01L 21/47635; H01L 27/1225; H01L 29/42356; H01L 29/42384; H01L 29/45; H01L 29/4908; H01L 29/495; G01N 15/0205; G01N 21/25; G01N 21/33
See application file for complete search history.

(56) References Cited

U.S. PATENT DOCUMENTS

| | | | |
|---|---|---|---|
| 2012/0092606 A1* | 4/2012 | Tai | H01L 27/1214 349/141 |
| 2012/0113072 A1* | 5/2012 | Oke | G02F 1/134363 345/204 |
| 2013/0083280 A1* | 4/2013 | Liu | H01L 27/1288 349/141 |
| 2015/0014693 A1* | 1/2015 | Lee | H01L 27/124 257/72 |

* cited by examiner

DISPLAY PANEL AND MANUFACTURING METHOD THEREOF

CROSS-REFERENCE TO RELATED APPLICATIONS

This application claims priority to Chinese Patent Application No. 201410434066.1 filed on Aug. 29, 2014, the contents of which are incorporated by reference herein.

FIELD

The subject matter herein generally relates to a display panel a method for manufacturing the display panel.

BACKGROUND

In-plane switching (IPS) mode liquid crystal display (LCD) panels are becoming more and more popular because they can present a wider viewing angle to a viewer than twisted nematic (TN) mode LCD panels. Generally, in a method for manufacturing the IPS mode LCD panel, a plurality of photomask may be used in different photo etching processes (PEPs) to form different circuit patterns of the IPS mode LCD panel.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a display panel and a method for manufacturing the same.

Figure 1:
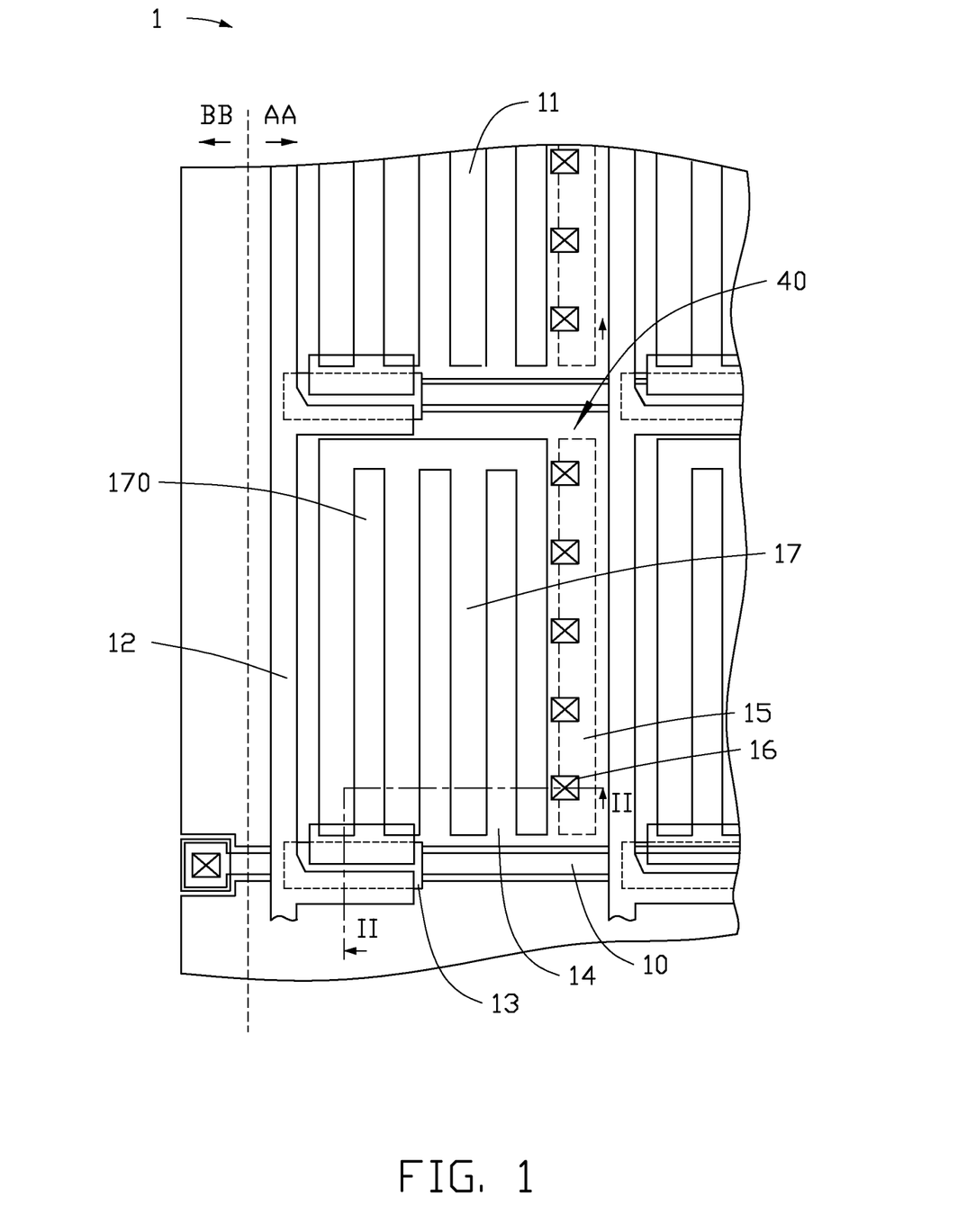
FIG. 1 illustrates a partial plan view of a display panel having a display area and a border area.
Figure 2:
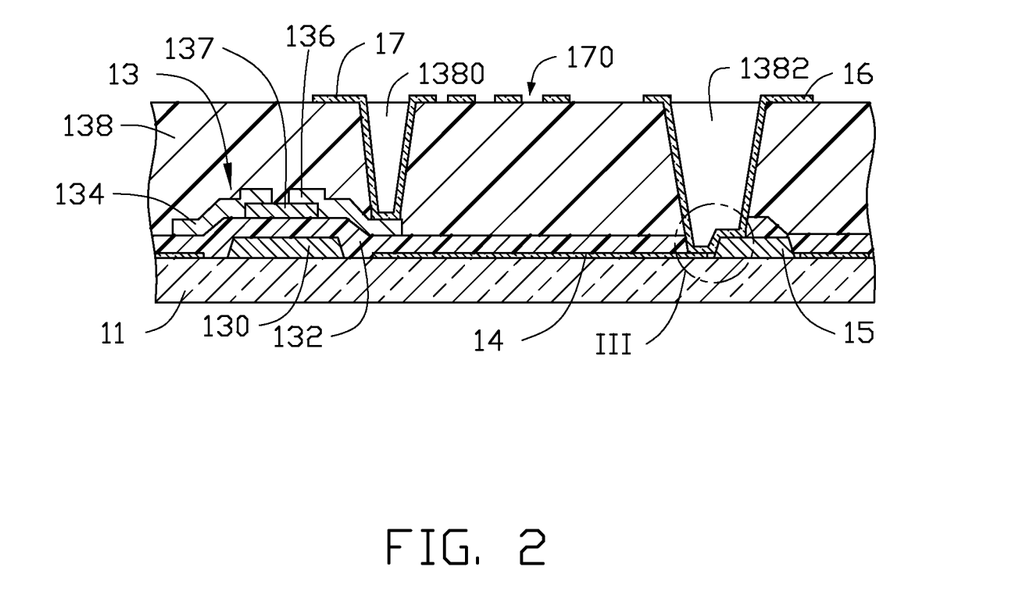
FIG. 2 illustrates is a cross-sectional view taken along line II-II of FIG. 1.

Referring to FIG. 1 and FIG. 2, FIG. 1 illustrates a partial plan view of a display panel 1, FIG. 2 is a cross-sectional view taken along line II-II of FIG. 1. In at least one embodiment, the display panel 1 can include a substrate 11, a plurality of gate lines 10, a plurality of data lines 12, a plurality of thin film transistors (TFTs) 13, a plurality of common electrodes 14, a plurality of common electrode lines 15, a plurality of coupling electrodes 16, and a plurality of pixel electrodes 17. The display panel 1 can be composed of a display area AA and a border area BB (also called non-display area or non-active area) surrounding the display area AA.

The gate lines 10 and the data lines 12 are intersected with each other to define a plurality of pixel units 40 within the display area AA. At least one of the common electrode line 15 is located in each of the pixel units 40. In at least one embodiment, the gate lines 10 are arranged in parallel, the data lines 12 are arrange in parallel as well as the gate lines 10, and the common electrode lines 15 are also arranged in parallel. The common electrode lines 15 can be in parallel with the data lines 12. The gate lines 10 can extend along a first direction while the data lines 12 can extend along a second direction perpendicular with the first direction. Thus, the pixel unit 40 is rectangular. Each pixel electrode 17 is located within a corresponding pixel unit 40 and is electrically coupled to corresponding TFT 13. The pixel electrode 17 can be made of transparent materials, such as indium tin oxide (ITO).

The common electrode 14 can be located in the display area AA of the display panel 1. The common electrode 14 is coupled to the at least one common electrode line 15 within a corresponding pixel unit 40 via a corresponding electrode 16, but the common electrode 14 is not contacted with the at least one common electrode line 15 within the corresponding pixel unit 40. In this embodiment, since short circuit issues may happen in the border area BB if the common electrode lines 15 extend to the border area BB, the common electrode lines 15 are located within the display area AA.

Each of the TFTs 13 is located in a corresponding pixel unit 40 and is coupled to a corresponding gate line 10 and a corresponding data line 12. Each TFT 13 can include a gate 130, a gate insulation layer 132, a source 134, a drain 136, a channel layer 137 and a flat layer 138. The channel layer 137 is coupled between the source 134 and the drain 136. In at least one embodiment, the TFTs 13 can be bottom-gate TFTs.

The gate 130 is formed on the substrate 11 and is coupled with a corresponding data line 10. The common electrodes 14 and the common electrodes lines 15 both are formed on the substrate 11 as well as the gate 130. The gate 130, the common electrodes 14, and the common electrode lines 15 are separated from each other to avoid electrical connections therebetween. The gate insulation layer 132 is coated on the substrate 11 and covers the gate 130 of each TFT 13, the common electrodes 14, and the common electrode 1 lines 15.

The channel layer 137 is located on the gate insulation layer 132 and corresponds with the gate 130. The source 134 and the drain 135 are formed on the gate insulation layer 132 and are respectively coupled at opposite sides of the channel layer 137. The source 134 is coupled to a corresponding data line 12.

Figure 3:
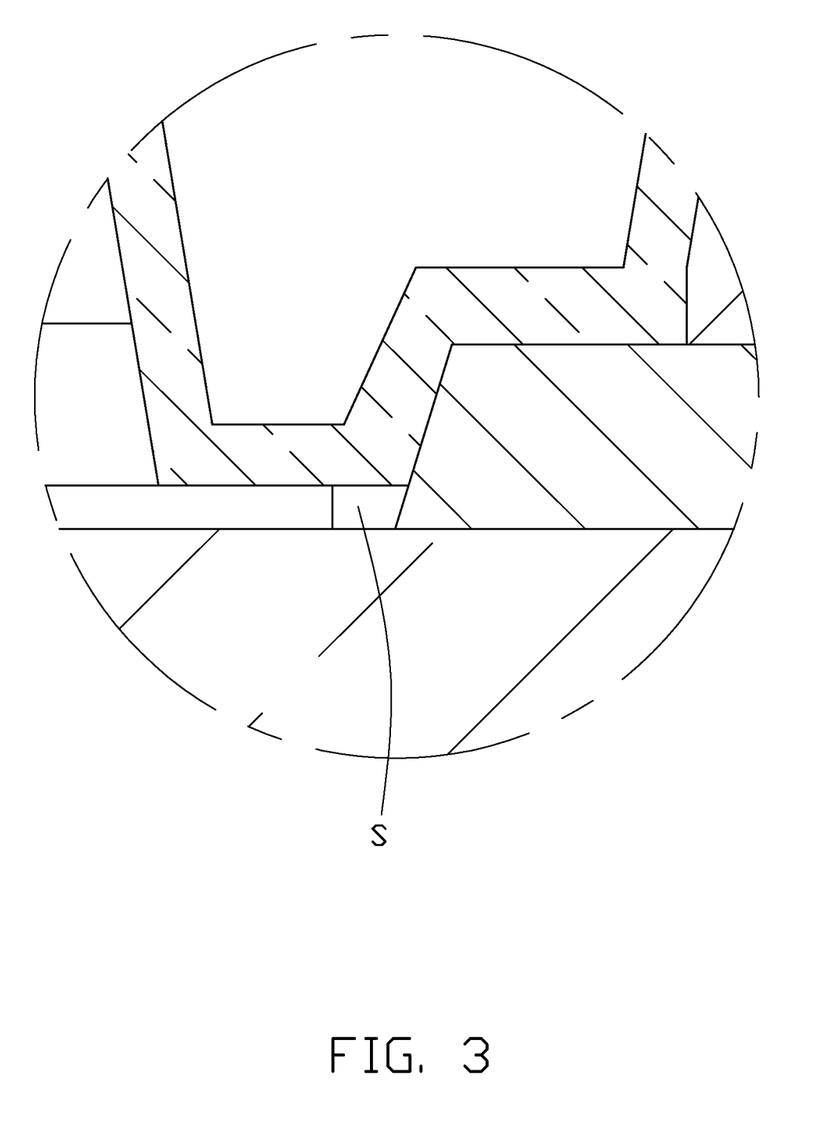
FIG. 3 is an enlarged view of a circle region III of FIG. 2.

The flat layer 138 is coated on the gate insulation layer 132 and covers the channel layer 137, the source 134 and the drain 136. The flat layer 138 defines a plurality of first contact holes 1380 and a plurality of second contact holes 1382 respectively corresponding with the drain 136 of each of the TFTs 13 and the common electrode lines 15. The pixel electrode 17 is coupled to the drain 136 via the first contact hole 1380. The coupling electrode 16 is coupled between a corresponding common electrode 14 and a corresponding common electrode line 15 via the second contact hole 1382. In this embodiment, as shown in FIG. 3, a space S is defined between the corresponding common electrode 14 and the corresponding common electrode line 15, thereby separating the corresponding common electrode 14 from the corresponding common electrode line 15.

Each pixel electrode 17 defines a plurality of slits 170 to corporate with the common electrode 14 within a corresponding pixel unit 40 to form a parallel electrical field. Thus, the display panel 1 can be an in-plane switching (IPS) mode liquid crystal display (LCD) panel.

Figure 4:
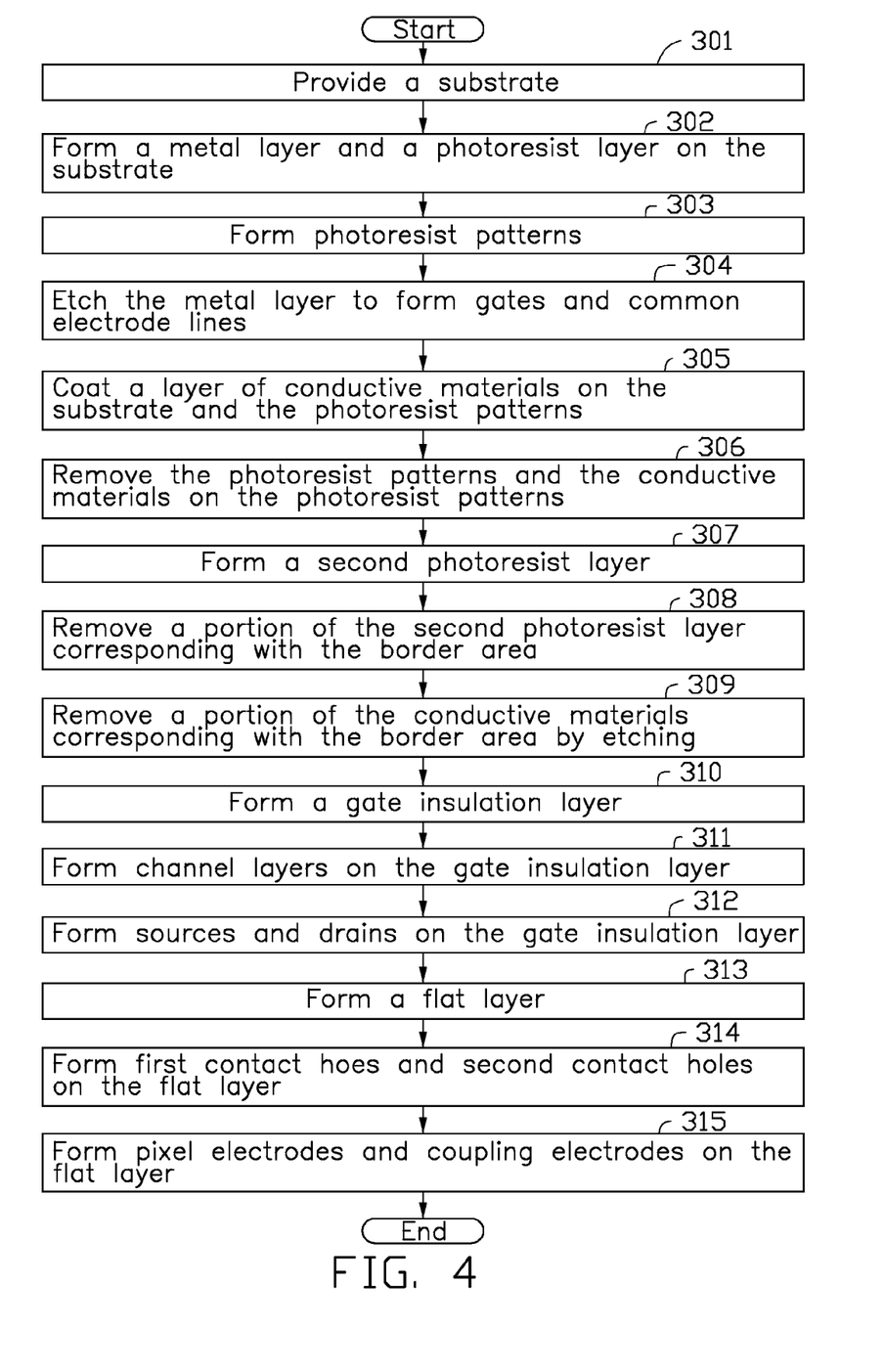
FIG. 4 illustrates a flowchart of a method for manufacturing the display panel 1 of FIG. 1 and FIG. 2.

FIG. 4 illustrates a flowchart of a method for manufacturing the display panel 1 of FIG. 1 and FIG. 2. The method is provided by way of example, as there are a variety of ways to carry out the method. Each block shown in FIG. 4 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 301.

At block 301, a substrate 11 is provided. The substrate can be a transparent substrate such as glass substrate or a plastic substrate. In other embodiments, the substrate 11 can be a translucent substrate, a non-transparent substrate or a flexible substrate.

Figure 5:
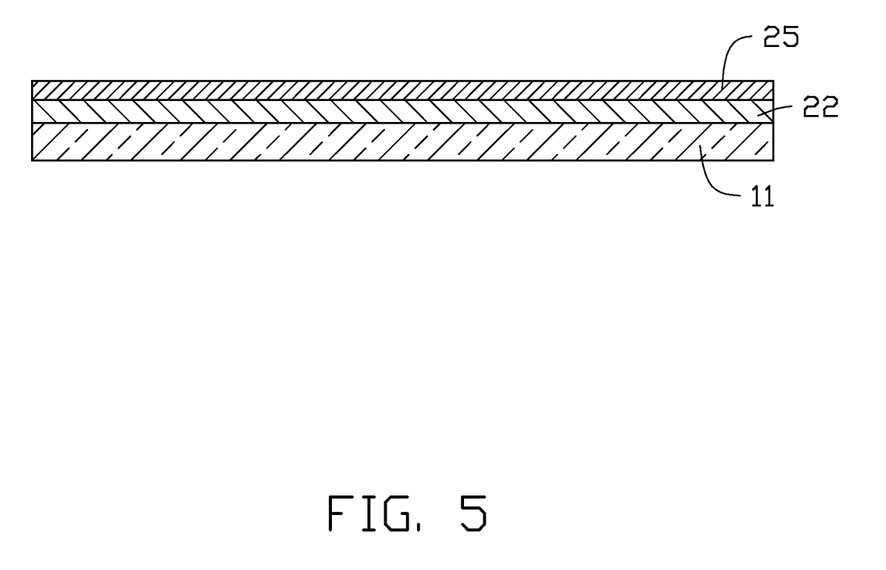
FIG. 5 illustrates a diagrammatic view of a metal layer is formed on a substrate and a first photoresist layer is formed on the metal layer.

At block 302, as shown in FIG. 5, a metal layer 22 is formed on the substrate 11 and a first photoresist layer 25 is formed on the metal layer 22

Figure 6:
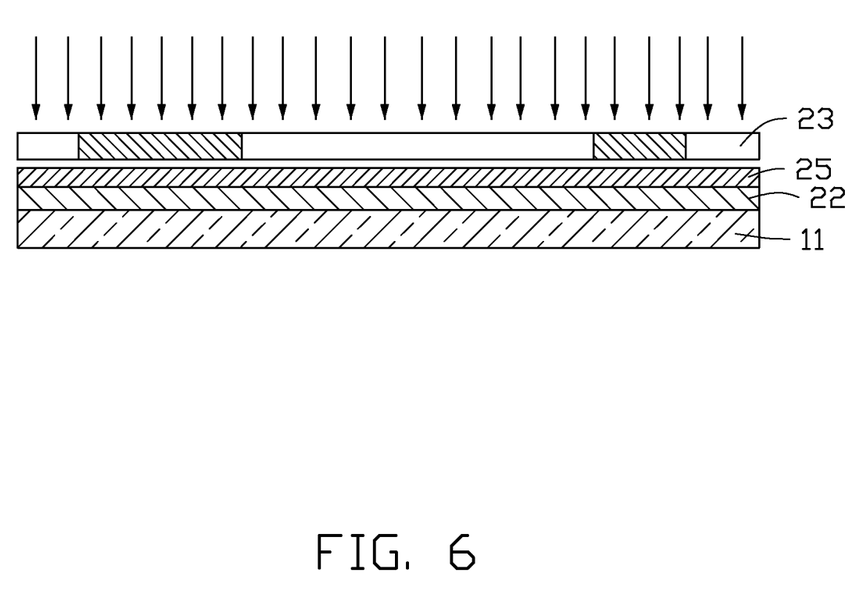
FIG. 6 illustrates a diagrammatic view of an exposure and development process is performed to pattern the photoresist layer.
Figure 7:
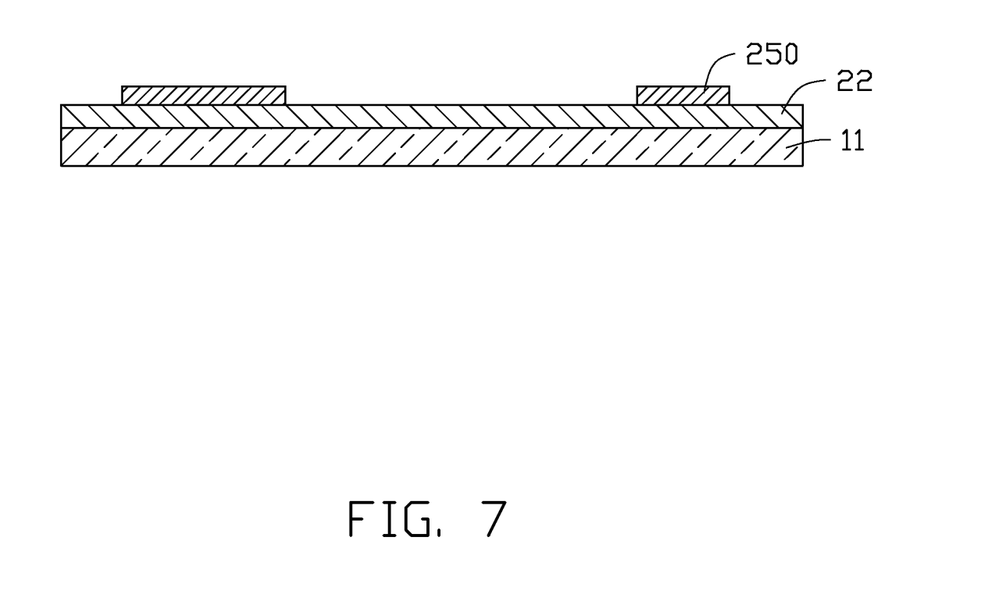
FIG. 7 illustrates a diagrammatic view of a plurality of photoresist patterns are formed on the metal layer.

At block 303, referring to FIG. 6 and FIG. 7, the first photoresist layer 25 is patterned by an exposure and development process using a photomask 23 to form a plurality of photoresist patterns 250 on the metal layer 22. The photomask 23 can be made of metal materials.

Figure 8:
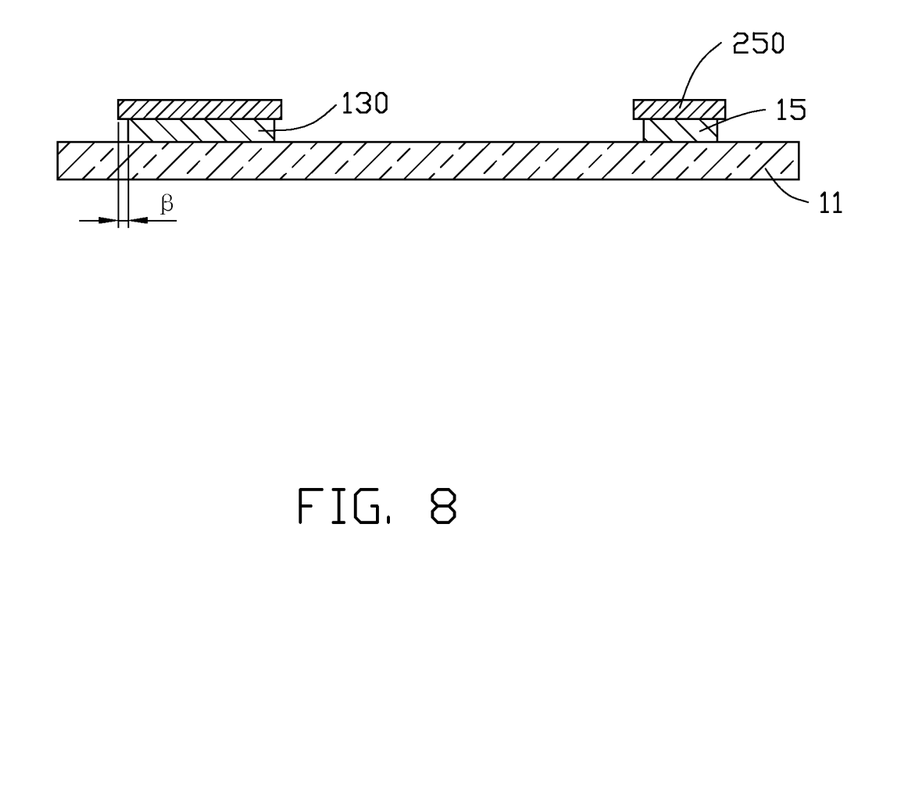
FIG. 8 illustrates a diagrammatic view of a plurality of gates and a plurality of common electrode lines are form on the substrate.

At block 304, as shown FIG. 8, the metal layer 22 is etched to form a plurality of gates 130 and a plurality of common electrode lines 15 on the substrate 11 which are covered the photoresist patterns 250. In this embodiment, only one gate 130 and one common electrode line 15 are shown in FIG. 8. Each gate 130 and each electrode line 15 are covered by the photoresist patterns 250. In at least one embodiment, the metal layer 22 can be etched by an over etching process. Thus, an area of the gate 130 is less than an area of a corresponding photoresist pattern 250 which covers the gate 130. For example, as shown in FIG. 8, a distance β is defined between an edge the gate 130 and a corresponding edge of the photoresist pattern 250 which covers the gate 130. Accordingly, an area of the common electrode line 15 is less than that of a corresponding photoresist pattern 250 which covers the common electrode line 15.

Figure 9:
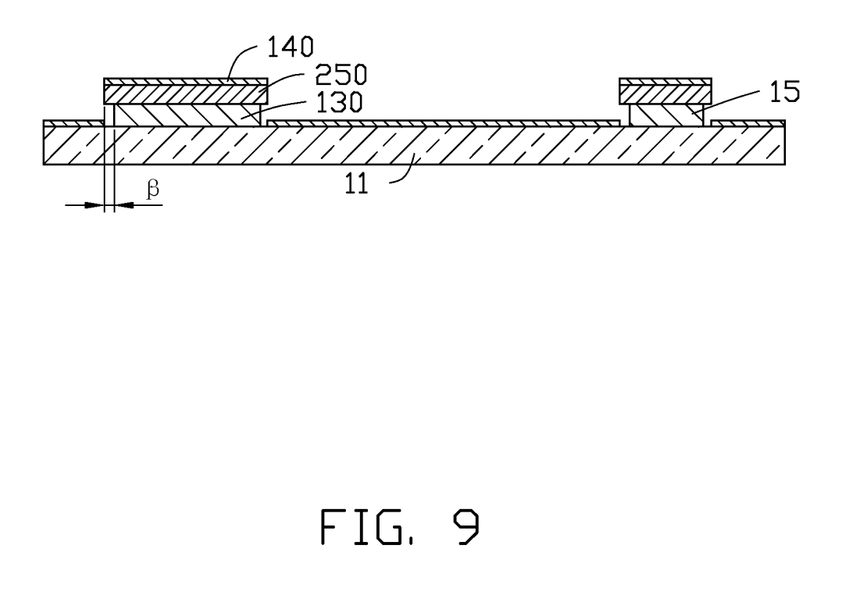
FIG. 9 illustrates a diagrammatic view of a layer of conductive materials is coated on the substrate and the photoresist patterns.

At block 305, as shown in FIG. 9, a layer of conductive materials 140 is coated on the substrate 11 and the photoresist patterns 250. In this embodiment, the layer of conductive materials 140 is coated on surfaces of the photoresist patterns 250 away from the substrate and is coated on a portion of a surface of the substrate 11 which is not covered by the photoresist patterns 250. The conductive materials 140 can be transparent conductive materials, such as transparent conductive films made of indium tin oxide (ITO). The conductive materials 140 serve as common electrodes 14 of the display panel 1. Since a distance β is defined between an edge of the gate 130 and a corresponding edge of the photoresist pattern 250 which covers the gate 130, the conductive materials 140 will not contact with the gates 130. Further, since the area of the common electrode line 15 is less than that of a corresponding photoresist pattern 250 covering the common electrode line 15, the conductive materials 140 will not contact with the gates 130.

Figure 10:
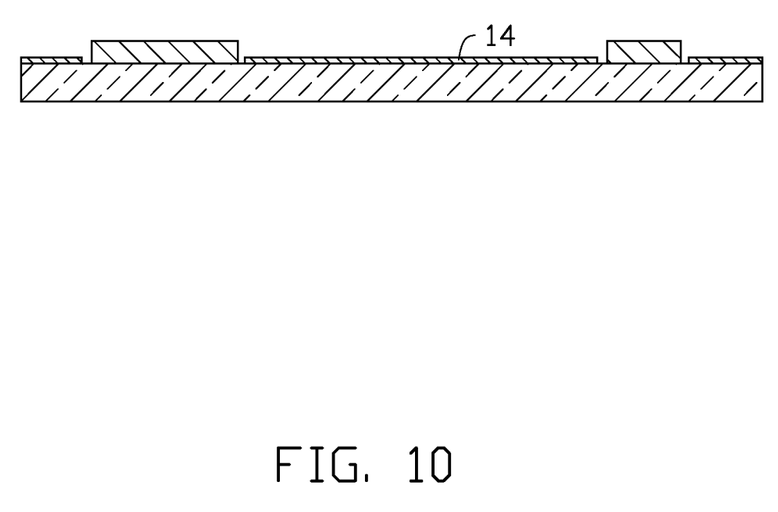
FIG. 10 illustrates a diagrammatic view of the photoresist patterns and a portion of the conductive materials on the photoresist pattern are removed from the substrate.

At block 306, as shown in FIG. 10, the photoresist patterns 250 and a portion of the conductive materials 140 on the photoresist pattern 250 are removed from the substrate 11. Thus, the other portion of the conductive materials 140 maintained on the substrate 11 form the common electrodes 14.

Figure 11:
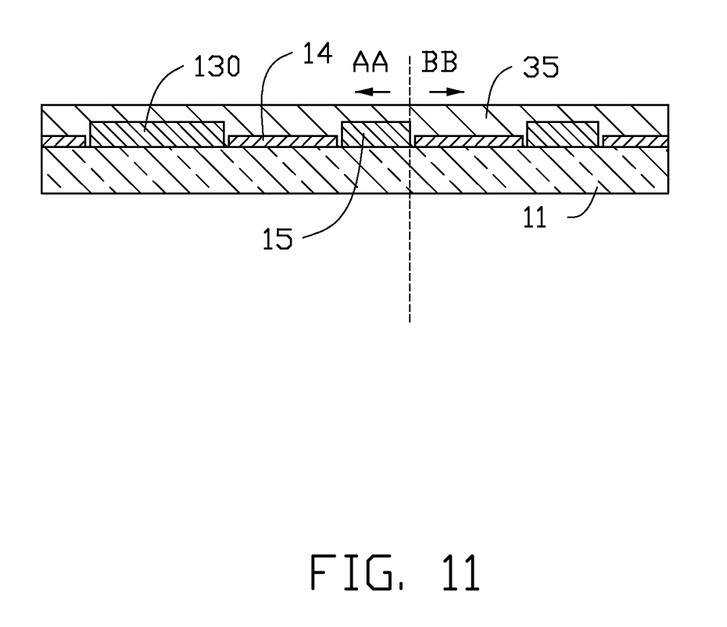
FIG. 11 illustrates a diagrammatic view of a second photoresist layer is formed on the substrate and covers the gates, the common electrodes, and the common electrode lines.

At block 307, as shown in FIG. 11, a second photoresist layer 35 is formed on the substrate 11 and covers the gates 130, the common electrodes 14, and the common electrode lines 15.

Figure 12:
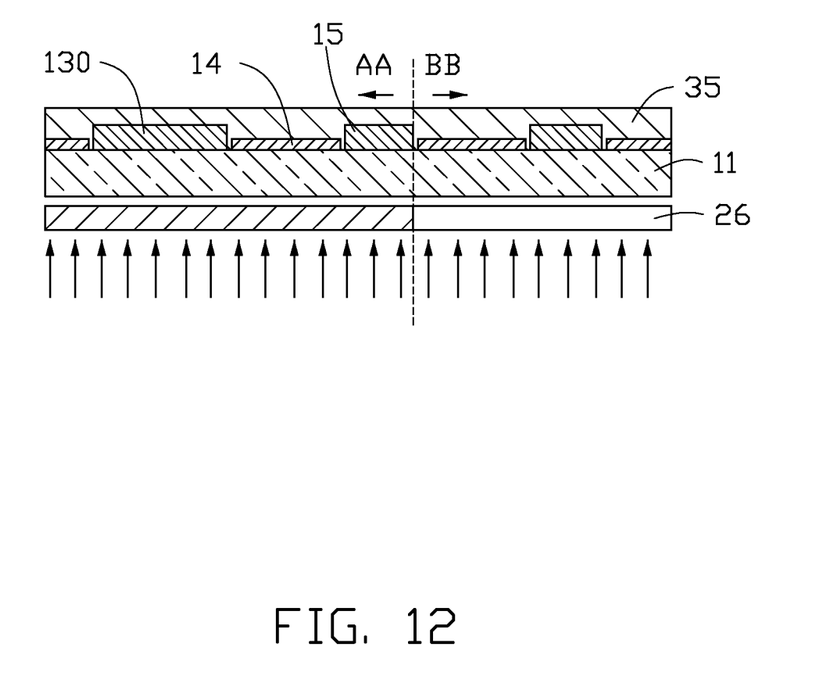
FIG. 12 illustrates a diagrammatic view of a portion of the second photoresist layer corresponding with the border area BB is removed.

At block 308, as shown in FIG. 12, a portion of the second photoresist layer 35 corresponding with the border area BB is removed. In at least one embodiment, an exposure process is first performed to expose the second photoresist layer 35 from a side of the substrate 11 away from the second photoresist layer 35 using an ultraviolet photomask 26, and then a development process is utilized to remove the portion of the second photoresist layer 35 corresponding with the border area BB.

Figure 13:
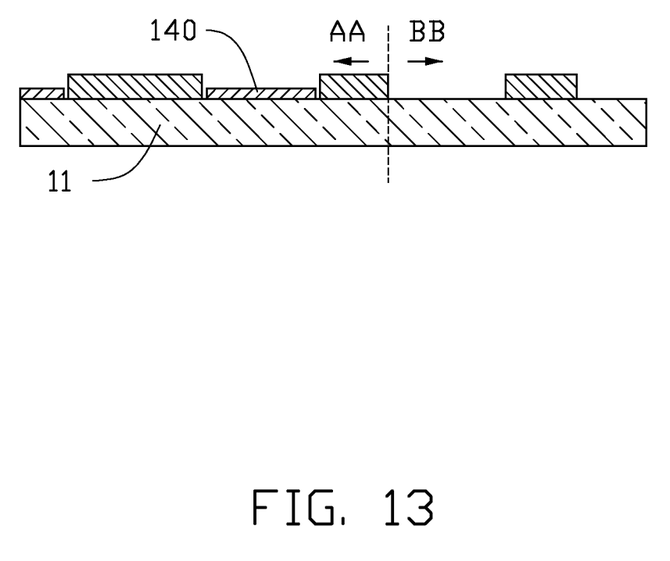
FIG. 13 illustrates a diagrammatic view of a portion of the conductive materials corresponding with the border area of the display panel is removed.

At block 309, as shown in FIG. 13, a portion of the conductive materials 140 corresponding with the border area BB is removed by an etching process. Then, the other portion of the second photoresist layer 35 coated on the substrate 11 corresponding with the display area AA is removed to expose the common electrodes 14 in the display area AA.

At block 310, a gate insulation layer 132 is formed on the substrate 11 to cover the gates 130, the common electrodes 14, and the common electrode lines 15.

At block 311, a plurality of channel layers 137 are formed on the gate insulation layer 132 corresponding with the gates 130.

At block 312, a plurality of sources 134 and drains 136 of the TFTs 13 are respectively formed on the gate insulation layer 132. The source 134 and the drain 136 are respectively coupled at opposite sides of a corresponding channel layer 137.

At block 313, a flat layer 138 is formed on the gate insulation layer 132 to cover the channel layers 137, the sources 134, and the drains 136.

At block 314, a plurality of first contact holes 1380 corresponding with the drains 136 and a plurality of second contact holes 1382 corresponding with the common electrode lines 15 and the common electrodes 14 are formed on the flat layer 138.

At block 315, a plurality of pixel electrodes 17 and a plurality of coupling electrodes 16 are formed on the flat layer 138. Each pixel electrode 17 is electrically coupled with a corresponding drain via a corresponding first contact hole 1380. Each coupling electrode 16 is coupled with a corresponding common electrode 14 and a corresponding common electrode line 15 via a corresponding second contact hole 1382, thereby making an electrical connection between the corresponding common electrode 14 and the corresponding common electrode line 15.

As described above, the gates 130 and the common electrodes 14 can be formed in a same exposure process using the photomask 22. Therefore, the cost for manufacturing the display panel 1 in the above mentioned method can be decreased compared with a traditional manufacturing method of the display panel 1.

What is claimed is:

1. A method for manufacturing a display panel having a display area and a border area surrounding the display panel comprising:
    forming a metal layer on a substrate and forming a first photoresist layer on the metal layer;
    patterning the photoresist layer by an exposure and development process using a photomask to form a plurality of photoresist patterns on the metal layer;
    etching the metal layer to form a plurality of gates and a plurality of common electrode lines on the substrate covered by the photoresist patterns;
    coating a layer of conductive materials on the substrate and the photoresist patterns, wherein the conductive materials are not contacted with the plurality of gates and the plurality of common electrode lines;
    removing the photoresist patterns and a portion of the conductive materials on the photoresist pattern to form a plurality of common electrodes on the substrate;
    forming a gate insulation layer on the substrate to cover the plurality of gates, the plurality of common electrodes, and the plurality of common electrode lines;
    forming a plurality of channel layers on the gate insulation layer, each of the plurality of channel layers corresponding to one of the plurality of gates;
    forming a plurality of sources and a plurality of drains on the gate insulation layer, wherein each pair of the source and the drain are respectively coupled to opposite sides of a corresponding channel layer;
    forming a flat layer on the gate insulation layer to cover the plurality of channel layers, the sources, and the drains;
    defining a plurality of contact holes in the flat layer, each of the plurality of contact holes extending through the flat layer and being between one of the plurality of common electrode lines and one of the plurality of common electrodes; and
    forming a plurality of pixel electrodes and a plurality of coupling electrodes on the flat layer, wherein each of the pixel electrodes is coupled to one of the plurality of drains; and each of the coupling electrodes is coupled between a corresponding common electrode and a corresponding common electrode line by one of the plurality of contact holes.

2. The method according to claim 1, before the gate insulation layer is formed on the substrate further comprising:
    forming a second photoresist layer on the substrate to cover the gates, the common electrodes, and the common electrode lines;
    removing a portion of the second photoresist layer corresponding with the border area of the display panel; and
    removing a portion of the conductive materials corresponding with the border area by an etching process.

3. The method according to claim 2, wherein the step of removing a portion of the second photoresist layer corresponding with the border area of the display panel comprises:
    exposing the second photoresist layer from a side of the substrate away from the second photoresist layer using an ultraviolet photomask; and
    developing the second photoresist layer to remove a portion of the second photoresist layer corresponding with the border area.

4. The method according to claim 1, wherein the metal layer is etched by an over etching process to make an area of the gate is less than an area of a corresponding photoresist pattern which covers the gate.

5. The method according to claim 4, wherein an area of the common electrode line is less than an area of a corresponding photoresist pattern which covers the common electrode line.

6. The method according to claim 1, wherein the common electrodes and the pixel electrodes are made of indium tin oxide.

7. The method according to claim 1, wherein the photomask is a metal photomask.

* * * * *